United States Patent
Wang et al.

(10) Patent No.: US 11,700,775 B2
(45) Date of Patent: Jul. 11, 2023

(54) SEMICONDUCTOR DEVICE

(71) Applicant: UNITED MICROELECTRONICS CORP., Hsin-Chu (TW)

(72) Inventors: Hui-Lin Wang, Taipei (TW); Po-Kai Hsu, Tainan (TW); Ju-Chun Fan, Tainan (TW); Yi-Yu Lin, Taichung (TW); Ching-Hua Hsu, Kaohsiung (TW); Hung-Yueh Chen, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 320 days.

(21) Appl. No.: 17/090,859

(22) Filed: Nov. 5, 2020

(65) Prior Publication Data

US 2022/0115587 A1    Apr. 14, 2022

(30) Foreign Application Priority Data

Oct. 13, 2020  (CN) .......................... 202011088594.8

(51) Int. Cl.
  *H10N 50/10*  (2023.01)
  *H10B 61/00*  (2023.01)
  *H10N 50/80*  (2023.01)
  *H10N 50/85*  (2023.01)

(52) U.S. Cl.
  CPC ............ *H10N 50/10* (2023.02); *H10B 61/22* (2023.02); *H10N 50/80* (2023.02); *H10N 50/85* (2023.02)

(58) Field of Classification Search
  None
  See application file for complete search history.

(56) References Cited

U.S. PATENT DOCUMENTS

| | | | |
|---|---|---|---|
| 2005/0274984 A1* | 12/2005 | Hosotani | H01L 21/76895 257/E21.59 |
| 2016/0071905 A1* | 3/2016 | Park | G06F 12/0802 711/104 |
| 2016/0133828 A1* | 5/2016 | Lu | H10N 50/01 257/421 |
| 2017/0104029 A1* | 4/2017 | Li | H10N 50/10 |
| 2019/0206928 A1* | 7/2019 | Li | H10N 50/80 |

(Continued)

OTHER PUBLICATIONS

Wang, the specification, including the claims, and drawings in the U.S. Appl. No. 16/698,924, filed Nov. 27, 2019.

(Continued)

*Primary Examiner* — Ali Naraghi
*Assistant Examiner* — Siangluai Mang
(74) *Attorney, Agent, or Firm* — Winston Hsu

(57) ABSTRACT

A semiconductor device includes a substrate, a first dielectric layer, a second dielectric layer, and a third dielectric layer. The first dielectric layer is disposed on the substrate, around a first metal interconnection. The second dielectric layer is disposed on the first dielectric layer, around a via and a second metal interconnection. The second metal interconnection directly contacts the first metal interconnection. The third dielectric layer is disposed on the second dielectric layer, around a first magnetic tunneling junction (MTJ) structure and a third metal interconnection. The third metal interconnection directly contacts the first MTJ structure and the second metal interconnection, and the first MTJ structure directly contacts the via.

15 Claims, 6 Drawing Sheets

(56) References Cited

U.S. PATENT DOCUMENTS

| | | | |
|---|---|---|---|
| 2019/0326509 A1* | 10/2019 | Yl | H10B 61/00 |
| 2020/0035908 A1* | 1/2020 | Ku | H01L 21/76802 |
| 2020/0176510 A1* | 6/2020 | Wang | G11C 11/16 |
| 2021/0066579 A1* | 3/2021 | Wang | H10N 50/80 |

OTHER PUBLICATIONS

Tsai, the specification, including the claims, and drawings in the U.S. Appl. No. 16/792,271, filed Feb. 16, 2020.

* cited by examiner

US 11,700,775 B2

SEMICONDUCTOR DEVICE

BACKGROUND OF THE INVENTION

1. Field of the Invention

The invention relates to a semiconductor device, and more particularly to a magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, and magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

One of the objectives of the present invention provides a semiconductor device, which includes a dummy magnetic tunneling junction (MTJ) with a novel structure, so as to be directly disposed within a logic region, thereby simplifying the layout pattern of the semiconductor device and improving the device functions.

To achieve the purpose described above, one embodiment of the present invention provides a semiconductor device including a substrate, a first dielectric layer, a second dielectric layer, and a third dielectric layer. The first dielectric layer is disposed on the substrate, around a first metal interconnection. The second dielectric layer is disposed on the first dielectric layer, around a via and a second metal interconnection. The second metal interconnection directly contacts the first metal interconnection. The third dielectric layer is disposed on the second dielectric layer, around a first magnetic tunneling junction (MTJ) structure and a third metal interconnection. The third metal interconnection directly contacts the first MTJ structure and the second metal interconnection, and the first MTJ structure directly contacts the via.

Overall speaking, the dummy MTJ of the present invention is directly disposed within a logic region of a general MRAM device, and the dummy structure of the dummy MTJ is caused by the metal interconnections disposed within the logic region, leading to the short circuit or the open circuit of MTJs. Through these arrangements, the semiconductor device of the present invention is allowable to integrate the logic region and the dummy MRAM region of the general MRAM device, for sufficiently shrinking the layout pattern thereof. In this way, the design of the MRAM device may save more space in element arrangement and greatly improve the leakage issue.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
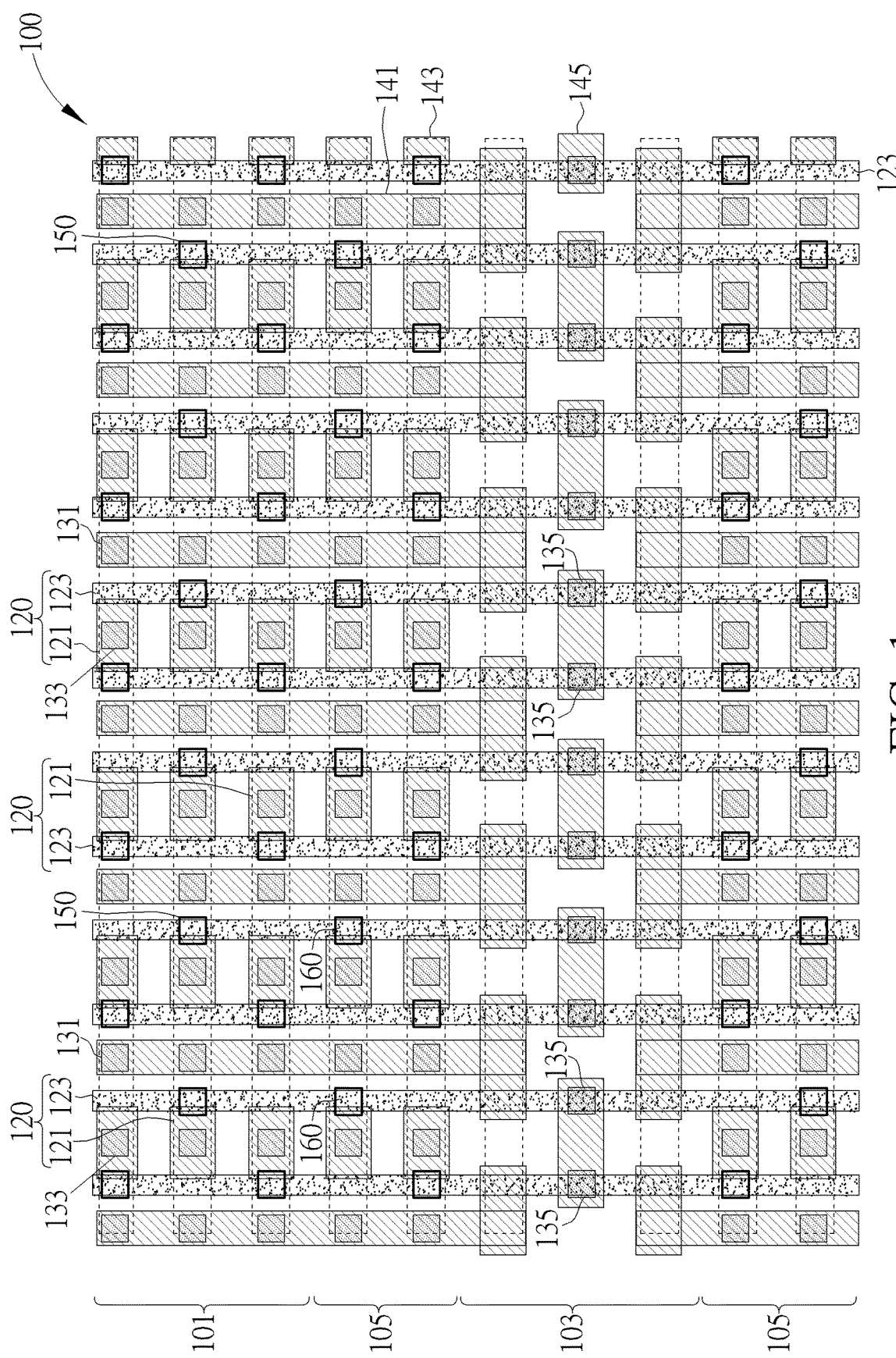
FIG. 1 is a schematic diagram illustrating a top view of a layout of a semiconductor device according to a first preferred embodiment of the present invention.

Please refer to FIG. 1, which shows a top view of a semiconductor device 100 according to a first preferred embodiment of the present invention. The semiconductor device 100 is for example a magnetoresistive random access memory (MRAM) device, and which includes a substrate (not shown in the drawings) such as a substrate made of semiconductor material, with the semiconductor material being selected from the group consisting of silicon (Si), germanium (Ge), Si—Ge compounds, silicon carbide (SiC), and gallium arsenide (GaAs). The substrate preferably includes a MRAM region 101 and a logic region 103 defined thereon. In the present embodiment, the MRAM region 101 may be disposed at least one outer side of the logic region 103, and a dummy MRAM region 105 is further disposed between the MRAM region 101 and the logic region 103, in which, a plurality of magnetic tunneling junction (MTJ) structures 150 is disposed in the MRAM region 101 and a plurality of dummy MTJ structures 160 is disposed in the dummy MRAM region 105. In other words, the MRAM region 101 and the logic region 103 are spaced apart by the dummy MRAM region 105 in the semiconductor device 100.

The MRAM region 101 of the substrate includes a plurality of metal-oxide semiconductor (MOS) transistors 120, which may be planar MOS transistors or non-planar (such as FinFETs) MOS transistors. More specifically, the MOS transistors 120 includes a plurality of doped regions 121 and a plurality of gate structures 123 (for example metal gates) across the doped regions 121, in which each of the doped regions 121 parallel extended along a same direction (such as the x-direction), and portions of the doped regions 121 disposed at two sides of the gate structures 123 may be configured as source/drain (not shown in the drawings) of each of the gate structures 123. Since the fabrication of planar or non-planar transistors is well known to those skilled in the art, the details of which are not explained herein for the sake of brevity.

An interlayer dielectric layer (not shown in the drawings) is further disposed on the substrate to cover the MOS transistors 120, and a plurality of plugs 131, 133, 135 and a plurality of metal layers 141, 143, 145 are disposed in the dielectric layer. In one embodiment, the metal layers 141, 143, 145 and the plugs 131, 133, 135 may be embedded within the dielectric layer according to a single damascene process or dual damascene process. Since single damascene process and dual damascene process are well known to those skilled in the art, the details of which are not explained herein for the sake of brevity. In the present embodiment, the metal layers 141, 143, 145 may be referred as the first level metal interconnect layer (M1), and other metal interconnections (not shown in the drawings) may be further disposed over the first level metal interconnect layer. However, in order to simplify the illustration, only the first level metal interconnect layer is illustrated in FIG. 1.

The plugs 131 and the metal layers 141 are electrically connected to the source of each of the MOS transistors 120. The metal layers 141 may be referred as a common source line which connects the source of MOS transistors 120 which are adjacent to each other, and the source may be further connected to an external voltage through other interconnections formed sequentially, with the aforementioned other interconnections including but not limited to for example the first level via conductor layer (V1), the second level metal interconnect layer (M2), the second level via conductor layer (V2), and the third level metal interconnect layer (M3) disposed over the first level metal interconnect layer. The plugs 133 and the metal layers 143 are electrically connection to the drain of each of the MOS transistors 120 respectively, as shown in FIG. 1. On the other hand, the plugs 135 and the metal layers 145 are disposed within the logic region 103, to electrically connect the gate structures 123 of the MOS transistors 120. Then, the MOS transistors 120 may be further connected to a word line (WL, not shown in the drawings) and a bit line (BL, not shown in the drawings) through the aforementioned other interconnections, for receiving voltage signals from the word line and the bit line respectively.

In the semiconductor device 100 of the present embodiment, the dummy MRAM region 105 is additionally provided to fill the space between the MRAM region 101 and the logic region 103. For example, the dummy MRAM region 105 includes two row of dummy MTJ structures 160 which are staggeredly arranged within the dummy MRAM region 105, while no MTJs including active MTJs such as the MTJ structures 150 or dummy MTJs such as the dummy MTJ structures 160 is disposed in the logic region 103. Through this arrangement, the layout pattern of the semiconductor device 100 is composed by the MRAM region 101, the dummy MRAM region 105 and the logic region 103, and the contamination and/or inducing leakage issue which is caused by upper level metal interconnect layers may be successfully avoided, so as to improve the device functions. It is noted that, the arranged number of the dummy MTJ structures 160 in the semiconductor device 100 is only for example, and the specific arrangement number of the dummy MTJ structures 160 within the dummy MRAM region 105 may be further adjustable according to the product requirements.

People well known in the arts should easily realize the semiconductor device in the present invention is not limited to the aforementioned embodiment, and may further include other examples or variety in order to meet the practical requirements. As an example, the layout of the semiconductor device 100 in the aforementioned embodiment consumes a lot of space, which may affect the overall performance substantially. The following description will detail the different embodiments of the semiconductor device in the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 2:
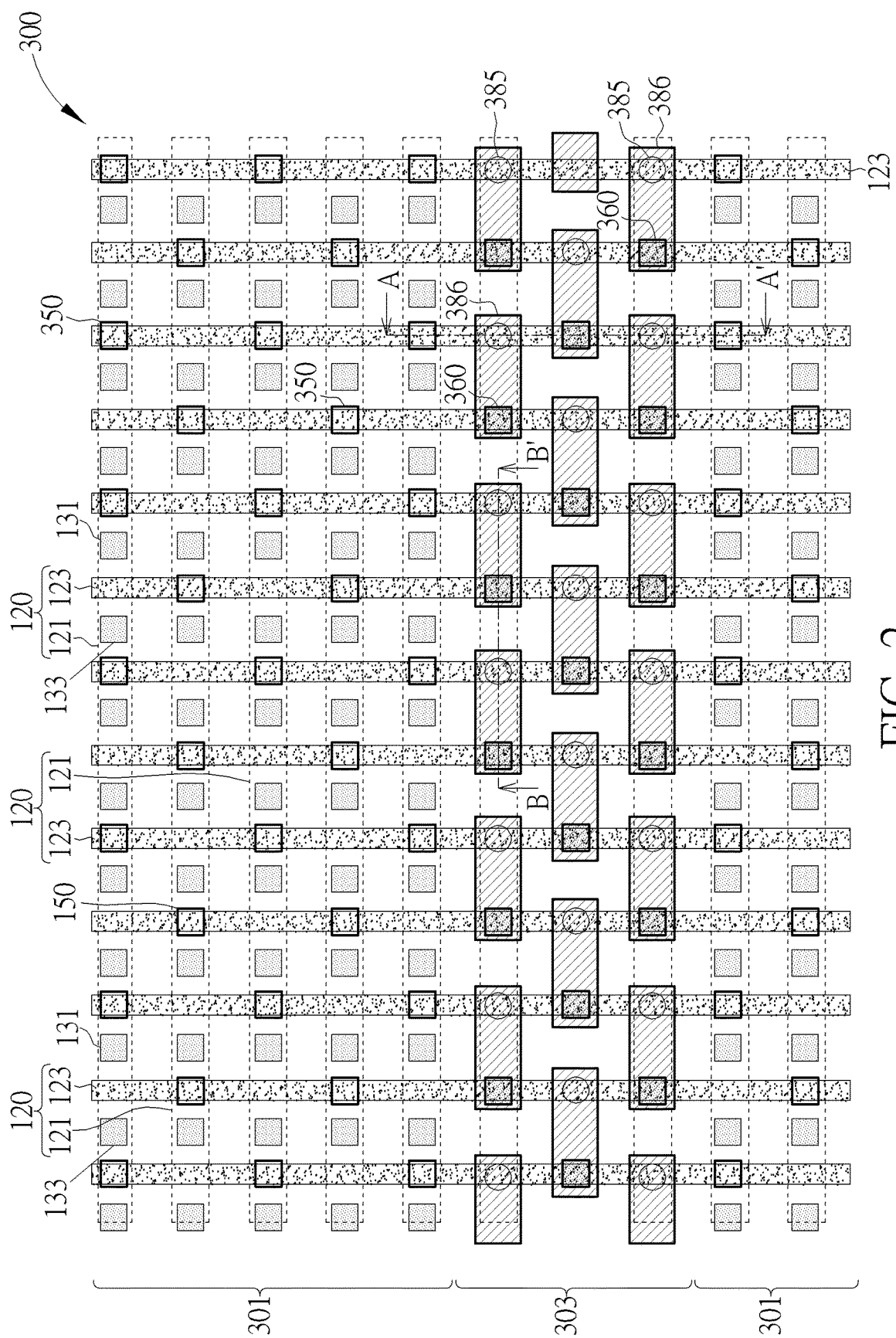
FIG. 2 is a schematic diagram illustrating a top view of a layout of a semiconductor device according to a second preferred embodiment of the present invention.
Figure 3:
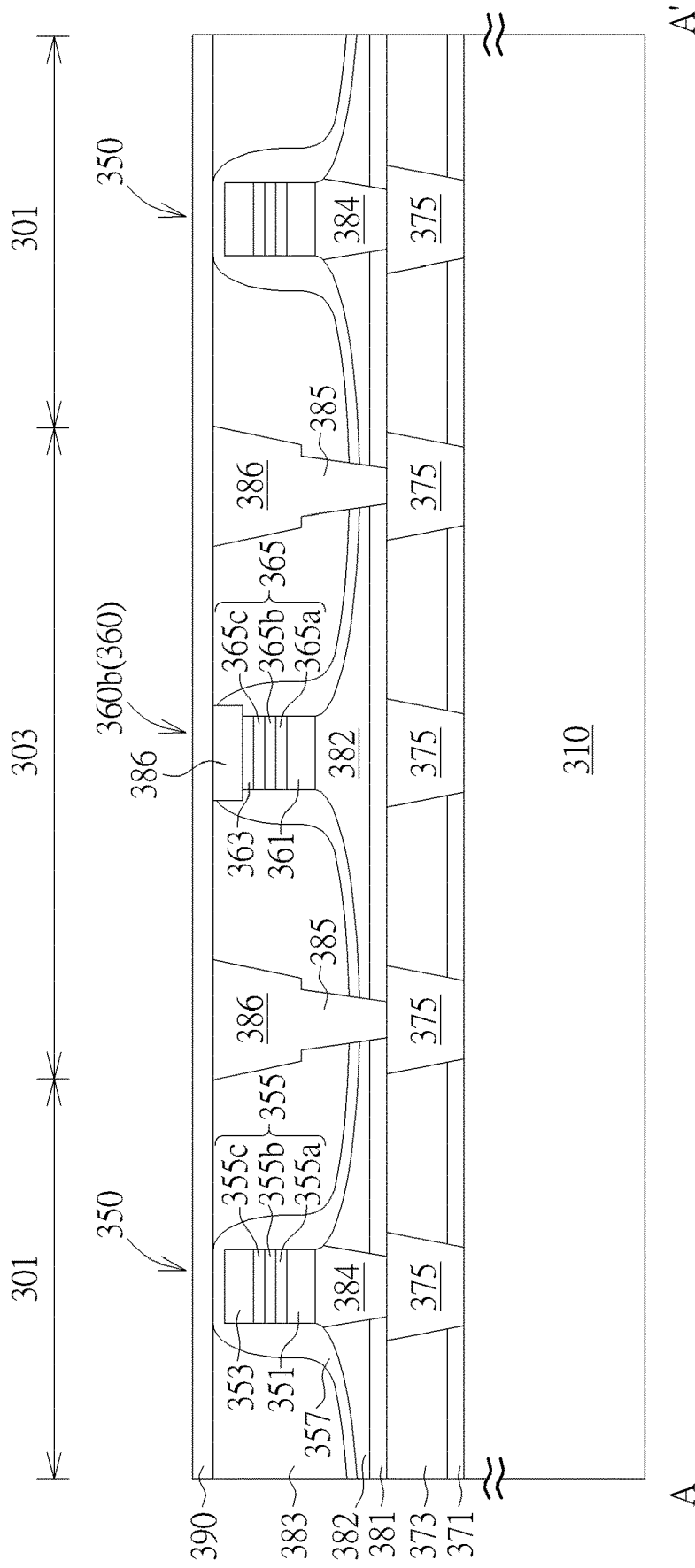
FIG. 3 is a schematic diagram illustrating a cross-sectional view of a semiconductor device according to a second preferred embodiment of the present invention.
Figure 4:
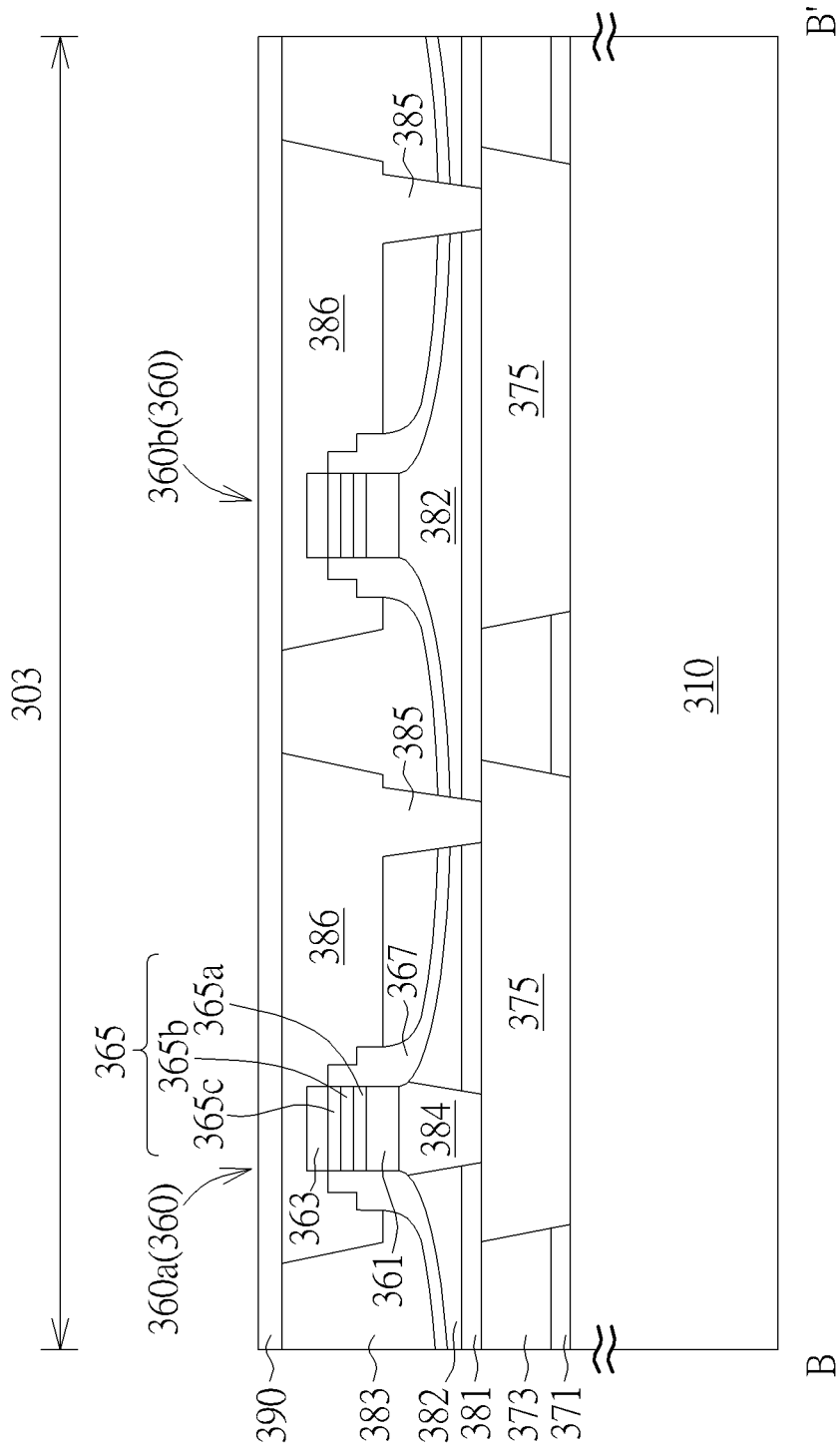
FIG. 4 is a schematic diagram illustrating another cross-sectional view of a semiconductor device according to a second preferred embodiment of the present invention.

Please refers to FIGS. 2-4, which show a semiconductor device 300 according to a second preferred embodiment of the present invention, in which FIG. 2 shows a top view of the semiconductor device 300, and FIG. 3 and FIG. 4 are respectively show a cross-sectional view take along cross lines A-A' and B-B' in FIG. 2. The semiconductor device 300 is also a MRAM device for example, and which includes a substrate 310, such as a substrate made of the aforementioned semiconductor material. Also, a plurality of the MOS transistors 120, and a plurality of plugs 131, 133 electrically connected to the MOS transistors 120 are disposed on the substrate 310. All similarities between the present embodiment and the aforementioned first embodiment will not be redundantly described hereinafter. For simplifying the description, the first level metal interconnect layer (for example including the metal layers 141, 143, 145) of the semiconductor device 300 has been omitted in FIG. 2, to only illustrate the second level via conductor layer (for example including the metal interconnections 385), the third level metal interconnect layer (for example including the metal interconnections 386), and the MTJs (for example including the MTJ structures 350 and the dummy MTJ structures 360) disposed over the first level metal interconnect layer. In FIG. 3 and FIG. 4, the first level metal interconnect layer, the MOS transistors 120 and the plugs 131,133 are omitted to only illustrate the second level metal interconnect layer (for example including metal interconnections 375), the second via conductor layer, the third level metal interconnect layer, and the MTJs of the semiconductor device 300.

In the present embodiment, the substrate 310 includes a MRAM region 301 and a dummy MRAM region 303 defined thereon. The dummy MRAM region 303 integrates the dummy MRAM region 105 and the logic region 103 of the aforementioned first embodiment, that is, the dummy MTJs disposed within the dummy MRAM region 105 and the interconnection disposed within the logic region 103 are jointly disposed in the same region namely the dummy MRAM region 303 of the present embodiment. Specifically, a plurality of the MTJ structures 350 is also disposed within the MRAM region 301, and a plurality of dummy MTJ structures 360 is disposed within the MRAM region 303 in a staggered arrangement, wherein the dummy MTJ structures 360, and a plurality of metal interconnections 385 which is also disposed within the dummy MRAM region 303, are repeatedly arranged by repeating one dummy MTJ structure 360 followed by one metal interconnection 385, as shown in FIG. 2.

As shown in FIG. 3 and FIG. 4, a stop layer 371, an inter-metal dielectric layer 373 and a plurality of the metal interconnections 375 are further disposed on the substrate 310. Specifically, the stop layer 371 and the inter-metal dielectric layer 373 sequentially cover the first level metal interconnect layer and other active elements (not shown in the drawings) or passive elements (not shown in the drawings) rather disposed on the substrate 310 or disposed in the substrate 310, around the metal interconnections 375. Moreover, a plurality of plugs 384 and the metal interconnections 385 disposed within the dummy MRAM region 303 are further disposed on the inter-metal dielectric layer 373, to electrically connect the metal interconnections 375 disposed underneath. Then, the MTJ structures 350, the dummy MTJ structures 360 and/or the metal interconnections 386 are disposed on the plugs 384 and the metal interconnections 385, wherein a stop layer 381 and an inter-metal dielectric layer 382 further surrounds the plugs 384 and the metal interconnections 385, and another inter-metal dielectric layer 383 disposed on the inter-metal dielectric layer 382 surrounds the MTJ structures 350, the dummy MTJ structures 360 and the metal interconnections 386. Accordingly, the metal interconnections 386 may be electrically connected to the metal interconnections 375 through the metal interconnections 385. Also, another stop layer 390 is further disposed on the substrate 310, to cover the MTJ structures 350, the dummy MTJ structures 360, the metal interconnections 386, and the inter-metal dielectric layer 383.

In the present embodiment, each of the aforementioned metal interconnections 375, 385, 386 may be embedded within each inter-metal dielectric layer (for example including the inter-metal dielectric layers 373, 382, 383) and/or each stop layer (for example including the stop layers 371, 381) according to a single damascene process or dual damascene process, to electrically connect with each other. Preferably, each of the metal interconnections 375 includes a trench conductor, to be referred as the second level metal interconnect layer, each of the metal interconnections 385 includes a via conductor, to be referred as the second level via conductor layer, and each of the metal interconnections 386 includes a trench conductor, to be referred as the third level metal interconnect layer, but is not limited thereto.

Also, each of the metal interconnections 375, 385, 386 may further include a barrier layer (not shown in the drawings) and a metal layer (not shown in the drawings) which are sequentially deposited in the trenches or the via, in which the barrier layer may be selected from the group consisting of titanium (Ti), titanium nitride (TiN), tantalum (Ta), and tantalum nitride (TaN), and the metal layer may be selected from the group consisting of tungsten (W), copper (Cu), aluminum (Al), titanium aluminide (TiAl), and cobalt tungsten phosphide (CoWP). The metal layer preferably includes copper, but is not limited thereto. On the other hand, the material of the plugs 384 may be selected from the group consisting of tungsten, copper, aluminum, titanium aluminide, and cobalt tungsten phosphide, and preferably, the material of the plugs 384 may be different from that of the metal layer, but is not limited thereto. In the present embodiment, the inter-metal dielectric layers 373, 383 preferably include a dielectric material with ultra-low dielectric constant, the inter-metal dielectric layer 382 preferably includes tetraethyl orthosilicate (TEOS), and the stop layers 371, 381, 390 preferably include nitrogen doped carbide (NDC), silicon nitride, silicon carbon nitride (SiCN), or a combination thereof.

Next, in the present embodiment, each of the MTJ structures 350 and each of the dummy MTJ structures 360 may respectively include a bottom electrode 351, 361, a top electrode 353, 363, a MTJ stack 355, 365 and a spacer 357, 367. Specifically, each bottom electrode 351, 361 of the MTJ structures 350 and the dummy MTJ structures 360 is disposed on the plugs 384 or on the inter-metal dielectric layer 382, and each MTJ stack 355, 365 and each top electrode 353, 363 are sequentially stacked on each bottom electrode 351, 361, with each spacer 357, 367 entirely covering the sidewall and the top surface of the top electrode 353, 363, the MTJ stack 388, 365 and the bottom electrode 351, 361. The spacer 357, 367 may further extend to the inter-metal dielectric layer 382, and cover a portion of the sidewall of the plugs 384 and the metal interconnections 385, as shown in FIG. 3 and FIG. 4. Preferably, each of the MTJ structures 350 and each of the dummy MTJ structures 360 include a fixed layer 355a, 365a, a barrier layer 355b, 365b, and a free layer 355c, 365c stacked from bottom to top. The bottom electrodes 351, 361 and top electrodes 353, 363 preferably include a conductive material including but not limited to for example Ta, Pt, Cu, Au, Al, or a combination thereof. The fixed layer 355a, 365a may include an antiferromagnetic (AFM) material including but not limited to for example ferromanganese (FeMn), platinum manganese (PtMn), iridium manganese (IrMn), nickel oxide (NiO), or a combination thereof, in which the fixed layer 355a, 365a is formed to fix or limit the direction of magnetic moment of adjacent layers. The barrier layer 355b, 365b may include an insulating material including but not limited to for example oxides such as aluminum oxide ($AlO_x$) or magnesium oxide (MgO). The free layer 355c, 365c may include a ferromagnetic material including but not limited to for example iron, cobalt, nickel, or alloys thereof such as cobalt-iron-boron (CoFeB). The spacers 357, 367 may include a dielectric material including but not limited to silicon nitride.

It is noted that, if viewed from the cross-sectional views according to FIGS. 3-4, each of the MTJ structures 350, each of the dummy MTJ structures 360, and the third level metal interconnect layer (for example including the metal interconnections 386) are preferably all disposed in the inter-metal dielectric layer 383, and the plugs 384 and the second level via conductor layer (for example including the metal interconnections 385) are preferably both disposed in the inter-metal dielectric layer 382, wherein, each of the MTJ structures 350 is disposed directly above the plugs 384, with the stop layer 390 further covering the top of the MTJ structure 350. On the other hand, the dummy MTJs such as the dummy MTJ structure 360a as shown at the left side of FIG. 4 may be disposed directly above the plugs 384, or the dummy MTJs such as the dummy MTJ structure 360b as shown at the right side of FIG. 4 may also be disposed directly above the inter-metal dielectric layer 382 without in contact with any metal interconnection, wherein the top of the dummy MTJ structure 360 (including the dummy MTJ structures 360a, 360b) is covered by the metal interconnections 386. In one embodiment, the dummy MTJ structures 360a and the dummy MTJ structures 360b may be alternately arranged along a direction such as the direction along the cross lines B-B' as shown in FIG. 4, but is not limited thereto. In another embodiment, the dummy MTJ structures 360a and the dummy MTJ structures 360b may also be arranged in different arrangements for example only arranging the dummy MTJ structures 360a or only arranging the dummy MTJ structures 360b, but not limited thereto. Since a portion of the inter-metal dielectric layer 383 and a portion of the spacer 367 may be both etched while forming the metal interconnections 386, the metal interconnections 386 may directly contact the top electrode 363 of each dummy MTJ structure 360a, and then directly conduct with the metal interconnections 375 underneath through the metal interconnections 385 and/or the plugs 384, thereby leading to the short circuit of MTJ structures.

Figure 5:
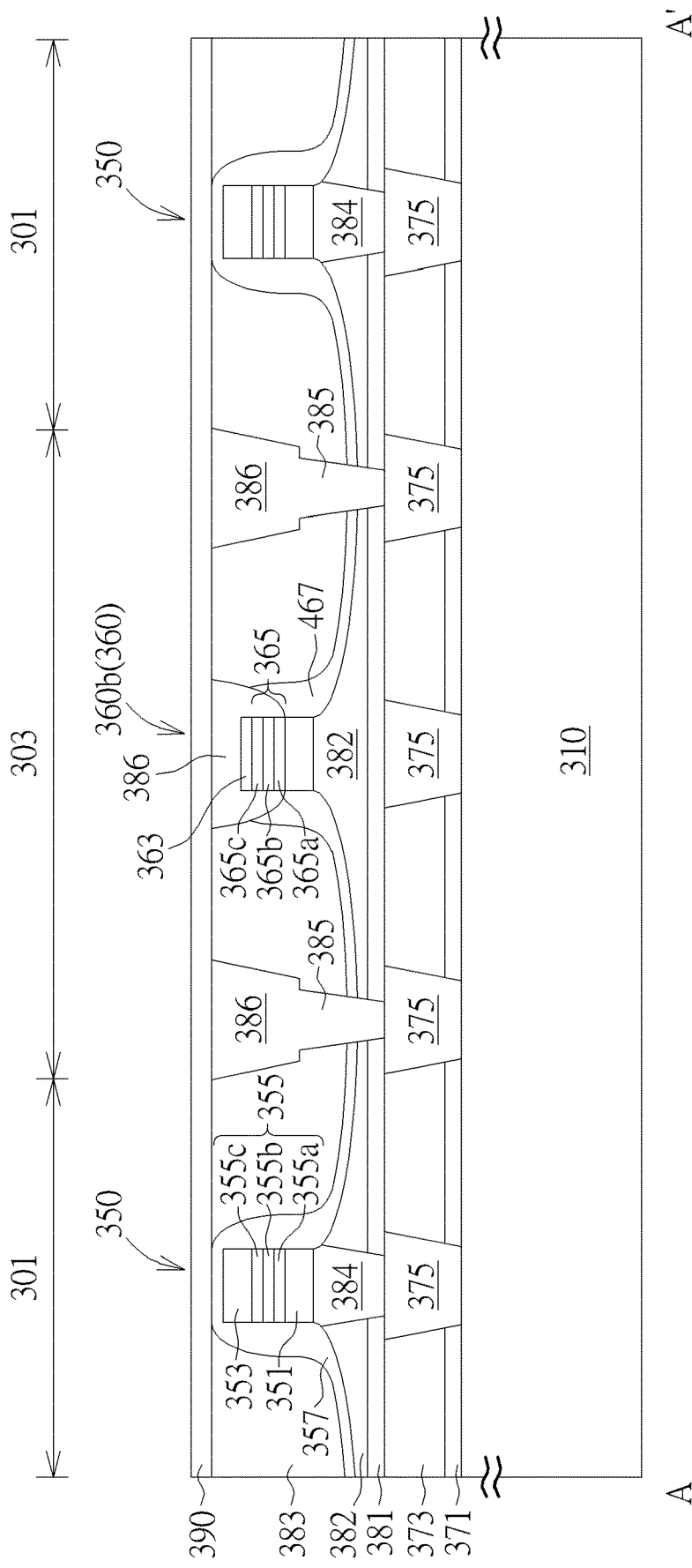
FIG. 5 is a schematic diagram illustrating a cross-sectional view of a semiconductor device according to another preferred embodiment of the present invention.
Figure 6:
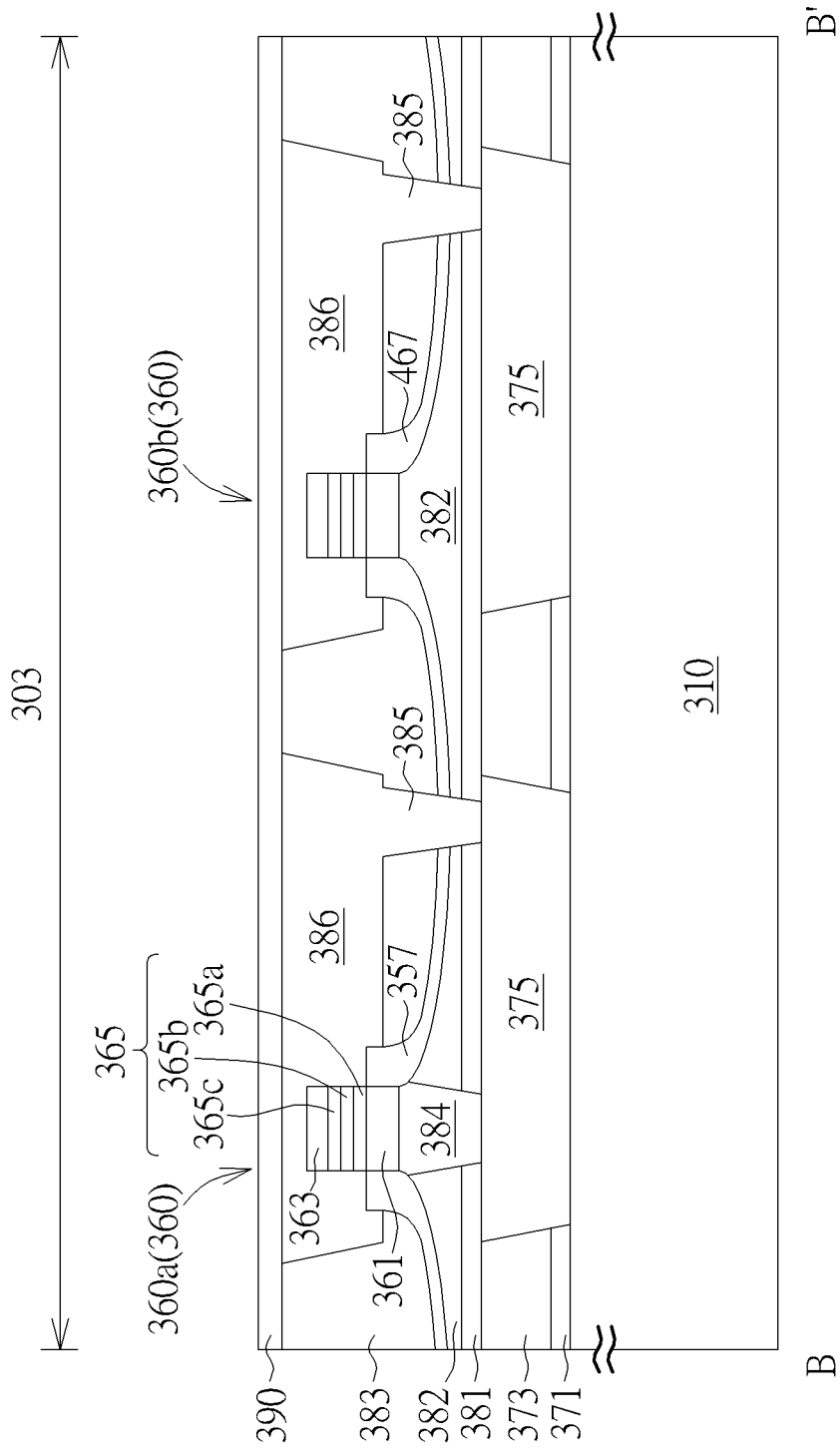
FIG. 6 is a schematic diagram illustrating another cross-sectional view of a semiconductor device according to another preferred embodiment of the present invention.

It is also noted that, the etching degree of the spacers 367 may be adjustable according to practical product requirements, during the formation of the metal interconnections 386. For example, in one embodiment, the portion of each spacer 367 covered on each top electrode 363 may be completely removed while performing the etching process, and another portion of each spacer 367 covered on the sidewall of each MTJ stack 365 and each bottom electrodes 361 may be partially removed without directly exposing the MTJ stack 365 or the bottom electrode 361. Accordingly, each of the spacers 367 may be etched to form a stepped structure, thereby exposing the top electrode 363 of each of the dummy MTJ structures 360. Then, the metal interconnections 386 disposed over the dummy MTJ structures 360 may directly contact the top electrode 363 as shown in FIG. 4. In one embodiment, each of the spacers 367 of the dummy MTJ structures 360a surrounds the sidewall of the MTJ stack 365, the bottom electrode 361, and a portion of the plug 384 disposed underneath, and each of the spacers 367 of the dummy MTJ structures 360b surround the MTJ stack 365, the bottom electrode 361 and a portion of the inter-metal dielectric layer 382, as shown in FIG. 4. However, in another embodiment, the portion of each spacer covered on each top electrode 363 and each MTJ stack 365 may also be completely removed while performing the etching process, so that, spacers 467 disposed only on the bottom electrodes 361, the plugs 384, and/or the inter-metal dielectric layer 382 may be formed thereby, as shown in FIG. 5 and FIG. 6. With these arrangements, the top surface of each of the spacers 467 may be coplanar with the bottom surface of each MTJ stack 365, and each of the metal interconnections 386 disposed on the dummy MTJ structures 360 may further coat on the top electrode 363 and the MTJ stack 365, as shown in FIG. 6.

In the semiconductor device 300 of the present embodiment, the metal interconnections 386 and the plugs 384 are respectively disposed above and below the dummy MTJs, so that, the dummy MTJ structures 360a may directly conduct with the metal interconnections 375 disposed underneath through the metal interconnections 385 and/or the plugs 384, thereby leading to the short circuit of the dummy MTJs. On the other hand, the dummy MTJ structure 360b may be directly disposed on the inter-metal dielectric layer 382, to lead to the open circuit of dummy MTJs. Accordingly, dummy MTJs with novel structures such as including the dummy MTJ structures 360a or the dummy MTJ structures 360b may be provided, and the aforementioned dummy MTJs may be directly disposed within a login region of a general MRAM device such as the logic region 103 of the aforementioned first embodiment, with the short circuit or the open circuit of the aforementioned dummy MTJs being caused by the interconnections disposed within the logic region. Then, the semiconductor device 300 of the present embodiment may integrate the logic region and the dummy MRAM region of the general MRAM device, to simplify the layout pattern of the semiconductor device 300.

Overall speaking, the dummy MTJ of the present invention is directly disposed within a logic region of a general MRAM device, and the dummy structure of the dummy MTJ is caused by the metal interconnections disposed within the logic region, leading to the short circuit or the open circuit of MTJs. Through these arrangements, the semiconductor device of the present invention is allowable to integrate the logic region and the dummy MRAM region of the general MRAM device, for sufficiently shrinking the layout pattern thereof. In this way, the design of the MRAM device may save more space in element arrangement and greatly improve the leakage issue.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a first dielectric layer disposed on the substrate, the first dielectric layer around a first metal interconnection;
   a second dielectric layer disposed on the first dielectric layer, the second dielectric layer around a via and a second metal interconnection, the second metal interconnection directly contacting the first metal interconnection; and
   a third dielectric layer disposed on the second dielectric layer, the third dielectric layer around a first magnetic tunneling junction (MTJ) structure and a third metal interconnection, wherein the via and the second metal interconnection respectively contact the first MTJ structure and the third metal interconnection, and the third metal interconnection directly contacts the first MTJ structure.

2. The semiconductor device according to claim 1, wherein the second metal interconnection and the third metal interconnection comprise a same conductive material.

3. The semiconductor device according to claim 1, wherein the via and the second metal interconnection comprise different conductive materials.

4. The semiconductor device according to claim 1, wherein the first MTJ structure further comprises a first MTJ stack and a first spacer, and the first spacer surrounds the first stack and the via.

5. The semiconductor device according to claim 4, wherein the first spacer comprises a stepped structure.

6. The semiconductor device according to claim 4, wherein the first spacer covers on the second dielectric layer.

7. The semiconductor device according to claim 4, wherein the first spacer is disposed on a sidewall of the via.

8. The semiconductor device according to claim 1, further comprising a logic region, wherein a plurality of the first MTJ structures and a plurality of the second metal interconnections are alternately arranged in the logic region.

9. The semiconductor device according to claim 1, wherein the first MTJ structure comprises a dummy MTJ structure.

10. The semiconductor device according to claim 1, wherein the third dielectric layer further around a second MTJ structure, a bottom surface of the second MTJ structure directly contacts the second dielectric layer, and the third metal interconnection directly contacts the second MTJ structure and the second metal interconnection.

11. The semiconductor device according to claim 10, wherein the second MTJ structure comprises a dummy MTJ structure.

12. The semiconductor device according to claim 10, wherein the second MTJ structure further comprises a second MTJ stack and a second spacer, and the second spacer surrounds the second stack and a portion of the second dielectric layer.

13. The semiconductor device according to claim 12, wherein the second spacer comprises a stepped structure.

14. The semiconductor device according to claim 12, wherein a top surface of the second spacer is coplanar with a bottom surface of the second MTJ structure.

15. The semiconductor device according to claim 11, further comprising a logic region, wherein a plurality of the first MTJ structures, a plurality of the second MTJ structures, and a plurality of second metal interconnections are alternately arranged in the logic region.

* * * * *